United States Patent [19]

Smith

[11] Patent Number: 5,677,823
[45] Date of Patent: Oct. 14, 1997

[54] BI-STABLE MEMORY ELEMENT

[75] Inventor: Charles Gordon Smith, Cambridge, United Kingdom

[73] Assignee: Cavendish Kinetics Ltd., United Kingdom

[21] Appl. No.: 549,697

[22] PCT Filed: May 6, 1994

[86] PCT No.: PCT/GB94/00977

§ 371 Date: Nov. 6, 1995

§ 102(e) Date: Nov. 6, 1995

[87] PCT Pub. No.: WO94/27308

PCT Pub. Date: Nov. 24, 1994

[30] Foreign Application Priority Data

May 6, 1993 [GB] United Kingdom ............ 9309327

[51] Int. Cl.$^6$ ............................................. H01H 59/00
[52] U.S. Cl. ............................. 361/234; 361/233; 200/181
[58] Field of Search ................................. 361/233, 234, 361/211, 207; 200/181, 404; 307/400

[56] References Cited

U.S. PATENT DOCUMENTS

| | | |
|---|---|---|
| 2,931,954 | 4/1960 | Diesel ............................ 200/181 |
| 4,065,677 | 12/1977 | Micheron et al. ............... 307/112 |
| 4,078,183 | 3/1978 | Lewiner et al. ................ 307/112 |
| 4,163,162 | 7/1979 | Micheron ........................ 307/400 |
| 4,205,242 | 5/1980 | Micheron et al. ............... 307/400 |
| 4,383,195 | 5/1983 | Kolm et al. ..................... 200/181 |
| 4,672,257 | 6/1987 | Oota et al. ...................... 200/181 |
| 4,979,149 | 12/1990 | Popovic et al. ................. 307/119 |
| 5,258,591 | 11/1993 | Buck ................................ 200/181 |

*Primary Examiner*—Fritz Fleming
*Attorney, Agent, or Firm*—Fishman, Dionne, Cantor & Colburn

[57] ABSTRACT

A bi-stable memory element (1) comprises a base contact (3), and a bridging contact (8), both made from an electrically conductive material. The bridging contact (8) is dimensioned so as to have two stable positions, in one of which the bridging contact (8) is in contact with the base contact (3), and in the other of which the bridging contact (8) is spaced apart from the base contact (3). Deflection means (4, 5) deflects the bridging contact (8) from one stable position to the other.

11 Claims, 2 Drawing Sheets

BI-STABLE MEMORY ELEMENT

This invention relates to memory elements for use in digital logic circuits and, in particular, memory elements which can be produced by standard integrated circuit manufacturing techniques.

In recent years there have been large advances in the electronics industry related to the fabrication of semiconductor devices for use in micro-processors and as computer memory elements. Semiconductor micro-processors are now found in a vast array of products, both at home and in the work place, but there are still many problems involved in using such devices in hazardous environments, where the device may be exposed to high energy particles such as cosmic rays, X-rays or electron beams which can destroy the semiconductor structure and/or alter current flow. Furthermore, semiconductor devices will only work within a narrow range of temperatures. High temperatures are a particular problem, above about 800K, where the dopants which are positioned in precise areas begin to diffuse at a rate that is exponentially dependent upon the temperature. More importantly, many of the insulating barriers used in such devices are thin enough that conduction through the barrier increases with increasing temperature. There are many areas, such as the design of devices for use in satellites, or in industrial processes, where high reliability is required in very harsh environments.

The sensitivity of semiconductors to the substrate on which they are formed creates a problem in that stacking of elements is complex and costly, reducing the ability to form small I.C. components. Another problem is that subsequent thermal annealing and oxidising work on higher layers damages the devices on lower layers, making reliable manufacture difficult.

Many semiconductor memory devices have a further problem in that they are unable to store data once their power supply has been cut off, leading to unwanted data loss or the use of more expensive non-volatile memory chips.

The present invention is directed to overcoming the above problems and provides a bi-stable memory element comprising:

- a base contact, made from an electrically conductive material;
- a bridging contact, made from an electrically conductive material, and dimensioned so as to have two stable positions, in one of which the bridging contact is in contact with the base contact, and in the other of which the bridging contact is spaced apart from the base contact; and
- deflection means, for deflecting the bridging contact from one stable position to the other.

Preferably, the contacts and deflection means are formed using the well know production techniques of photolithography, chemical deposition, sputtering, metal evaporation, or the like.

The deflection means may comprise a pair of electrodes, electrically insulated from the base contact and bridging contact, and operating in sequence to attract or deflect the bridging contact towards or away from the base contact by electrostatic forces. A device with faster switching can be provided by having deflection means both above and below the bridging contact.

Because the bridging contact is stable in both the contacted and uncontacted states, even if the power is disconnected from the device, its state is held and the data digit stored in it is not lost. Because the bridging and base contacts are not made from the usual semiconductor material, the device is not as easily affected by interfering radiation or high temperatures. Furthermore, as the device can be formed on any smooth substrate surface, stacking of devices is easily performed and element density can be increased.

Also, as this invention may be implemented using evaporation and sputtering of thin metal and insulating films, it can be much more simple to fabricate than devices based on semiconductor technologies. As the number of devices on a chip may be hundreds of millions, this technique will have considerable advantages in the yield of working devices per chip.

Examples of the present invention will now be described with reference to the accompanying drawings, in which:

FIGS. 1A, 1B, and 1C show a first example of a device according to the present invention with the bridging contact in contact with the base contact, in a partially deflected state, and in an uncontacted state;

Figure 1A:
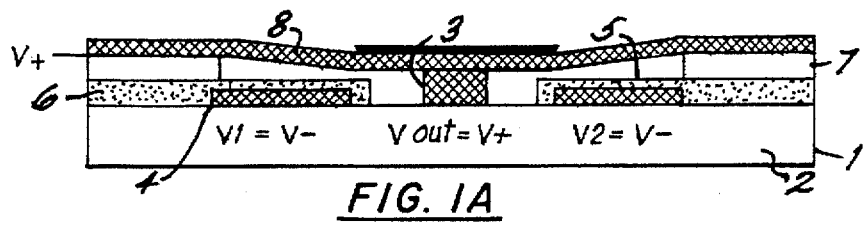

Referring to FIG. 1A an element 1 consists of a number of layers which are produced by deposition and/or etching techniques the type common in IC production. The layers are formed on a substrate 2 which can be made from any non-conductive material. A base contact 3 is positioned centrally on the substrate 2. Positioned on either side of the base contact are deflection electrodes 4,5 which are also positioned on the surface of the substrate 2, but which are enclosed within a non-conductive layer 6. On top of the non-conductive layer 6 is a further non-conductive layer 7 which forms two spacers 7. On top of the spacers 7, and extending from one spacer to the other, is a bridging contact 8 which is formed from a flexible and electrically conductive material. The bridging contact 8 is under compression, which is introduced at the manufacturing stage in one of a number of ways. One method of manufacturing the bridging contact 8 is by forming on a bulging resist layer which is then etched away. Alternative methods such as flexing the substrate 2 whilst applying the bridging contact layer 8, using a metal which naturally goes under compression under thermal evaporation on specific substrates, or by forming the bridging contact layer at a greatly different temperature to that of the device operating temperature and employing the difference in thermal expansion between substrate 2 and bridging element 8 to introduce compression into bridging element 8 are also possible.

As the bridging contact 8 is under compression, it has two stable states, in one of which it is flexed away from the base contact 3, and in the other of which it is flexed toward and in contact with the base contact 3. The contact 8 can be moved from one state to the other by application of voltage v+ to the two deflection electrodes 4,5. In this example, the bridging contact 8 has a positive voltage applied to it and so, when negative voltage v− is applied to both of the deflection electrodes, the bridging contact 8 is attracted towards and then brought into contact with the base contact 3 by electrostatic force. In order to move the bridging contact 8 to its uncontacted state, a positive voltage v+ is first applied to one of the deflection electrodes 5, moving part of the bridging contact 8 in a direction away from the substrate 2. A positive voltage is then applied to the other deflection plate 4 and the rest of the bridging contact 8 moves away from the substrate 2 and into its other stable state. The bridging contact 8 can be brought back into contact with the base contact 3 by reversing the above procedure. Employing stepped repulsion and attraction requires less energy than employing a single attracting/repelling plate and thus the power consumption of the device when switching is reduced.

Figure 3:
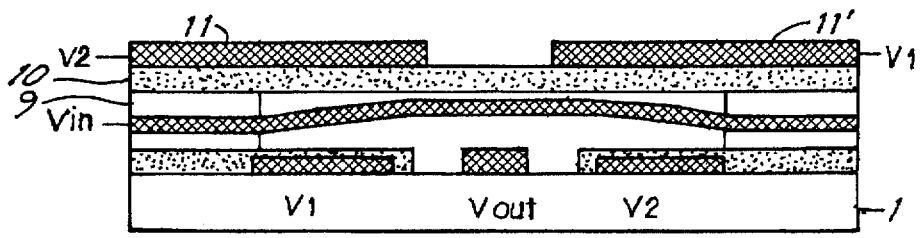
FIG. 3 shows a memory element similar to the FIG. 1 example with deflecting means disposed on both sides of the bridging contact.

The device of FIG. 3 comprises a further spacing layer 9 on top of the bridging contact 8, a second insulating layer 10, and a further two deflection electrodes 11,11'. Again, switching of the device is in a stepped fashion, with a positive voltage applied first to electrode 11 and simultaneously a negative voltage applied to electrode 4, and subsequently a positive voltage applied to electrode 11' and simultaneously a negative voltage to electrode 5. The device in FIG. 3 has a greater switching speed than the device of FIG. 1.

Figure 1B:
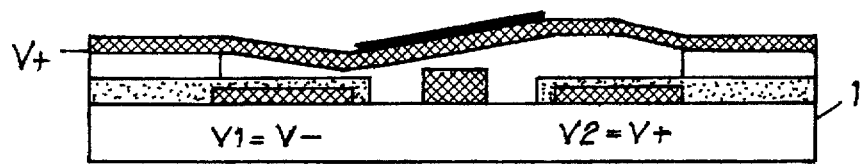
Figure 1C:
Figure 2:
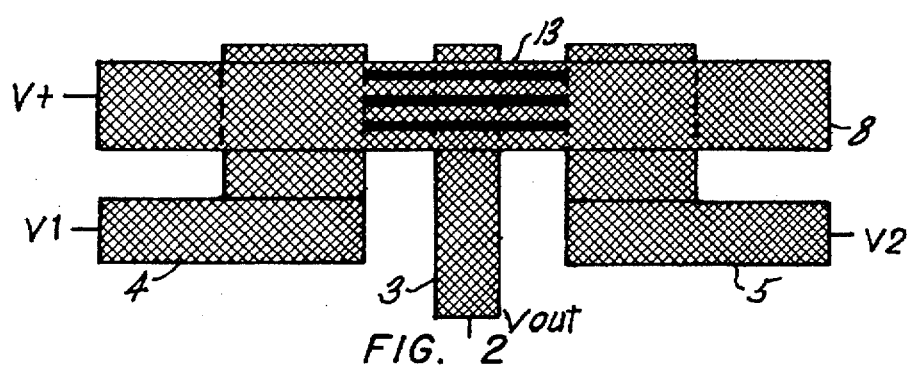
FIG. 2 shows a plan view of the conductive layers of the first example memory element.

To increase the switching speed of bridging contact 8 in FIG. 1, the central portion of the bridging contact 8 extending from a point adjacent the edge of electrode 4 which is closest to base contact 3 to a point which is adjacent the edge of electrode 5 which is closest to base contact 3 should be made as rigid as possible. This can be accomplished in several ways. In one embodiment the central portion of bridging contact 8 can be made corrugated, with the valleys of the corrugation 13 running along the direction of the span. The corrugation 13 would be put in the sacrificial layer which is subsequently removed from under contact 8. In another embodiment of the device, the central portion of contact 8 could be made more rigid with the addition of an extra layer 13.

When in use, the voltage V out of the base contact 3 can be monitored, with its level representing a binary 1 or 0 depending on whether it is equal to that of the bridging contact 8 or not.

Figure 4A:
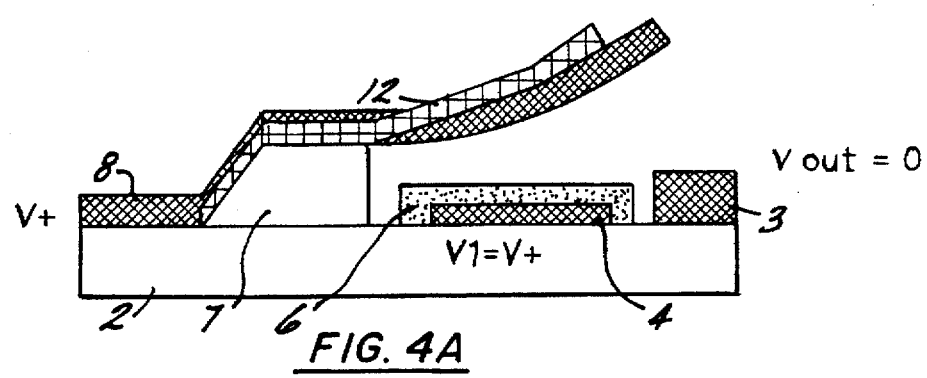
FIGS. 4A and 4B show a second example of a device according to the present invention in both a contacted and uncontacted state.
Figure 4B:
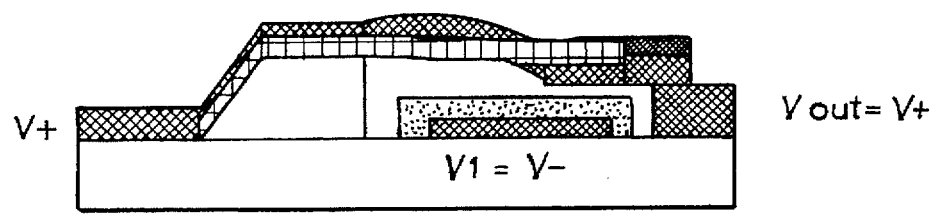
Figure 5:
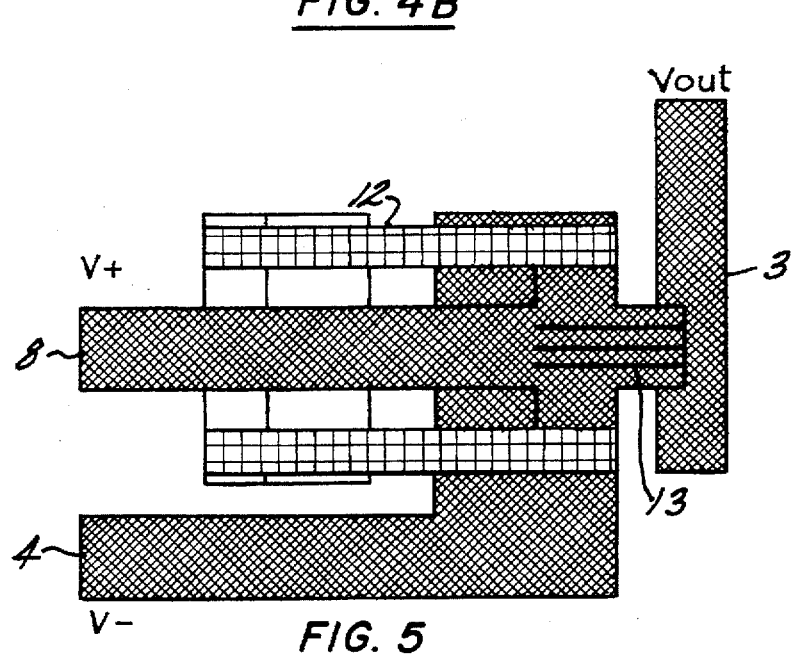
FIG. 5 shows a plan view of the conductive layers of the second example memory element; and, FIG. 6 shows a memory element similar to the FIG. 4 example with deflecting means disposed on both sides of the bridging contact.

FIGS. 4A and 4B show a side view of a second example of the present invention. A metal bridging contact 8 is fabricated above metal layers which form a contact 3 and electrode 4. Layer 12 is of a different material which is evaporated at the last stage. Layer 12 is designed to be under tension compared to bridging contact forming layer 8. Both these layers are fabricated on a sacrificial layer which is removed to leave bridging contact supported at one end. Layer 12 pulls bridging contact 8 into two stable positions, either up (out of contact) or down, when the sacrificial layer is removed by an etching process. The force required to move bridging contact 8 depends on the geometry of layer 8 and on the difference in tension between the two layers 8,12 when they are initially deposited onto the sacrificial layer. The bridging contact 8 can be switched between the two stable positions using voltages V+V− applied to electrode 4. When bridging contact 8 is in the down position it makes contact with contact 3, thus changing the voltage state of layer 3. Electrode 4 can have an insulating coating 6 to prevent conduction to contact 8 in the down position. As with the first example, strengthening corrugations or material 13 may be applied to bridging contact 8.

Figure 6:
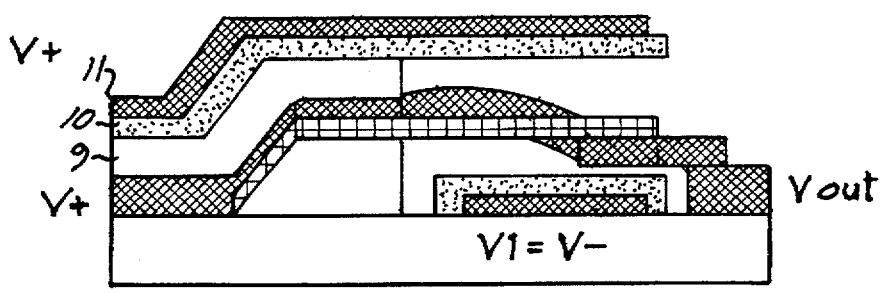

FIG. 6 shows the device of FIGS. 4A and 4B modified to have a faster switching time. This is achieved with the fabrication of additional layers 9, 10 and 11. Layers 9 and 10 are additional insulating layers and layer 11 is another conducting layer which would have an applied voltage opposite polarity to that of electrode 4 applied to it to cause the switching of contact 8. As with the first example, when in use the base contact 3 can be monitored, with its level representing a binary 1 or 0 depending whether it is equal to the arm contact or not.

To increase the speed of switching the voltage difference between both the electrodes 4 and/or 5 and bridging contact 8 can be increased, or the separation between both the electrodes 4 and/or 5 and contact 8 be decreased. As this will result in an increase in the electric field, to prevent dielectric breakdown between electrode 4 and/or 5 and contact 8, the ambient atmosphere should be controlled. For this reason the device can be packaged in a container filled with a gas of high relative breakdown voltage, such as Perflouropropane $C_3F_8$. The breakdown voltage between the electrodes 4 and/or 5 and bridging contact 8 can be maximised by ensuring insulator 6 is made from a material with a high breakdown electric field. This applies equally to both examples.

I claim:

1. In an integrated circuit, a bi-stable memory element comprising:

a base contact, made from an electrically conductive material;

a bridging contact having first and second sides, made from an electrically conductive material, and dimensioned so as to have two stable positions, in one of which the bridging contact is in contact with the base contact, and in the other of which the bridging contact is spaced apart from the base contact; and deflection means, for deflecting the bridging contact from one stable position to the other, at least part of the deflection means and the base contact being on the first side of the bridging contact.

2. A bi-stable memory element according to claim 1, wherein the contacts and deflection means are formed by photolithography, chemical deposition, sputtering, or metal evaporation.

3. A bi-stable memory element according to claim 1, wherein the bridging contact is cantilevered with its fixed end attached to a base layer by a support, the bridging contact being biased into one of two stable positions by a biasing layer.

4. A hi-stable memory element according to claim 1, wherein the deflection means comprises a pair of electrodes, electrically insulated from the base contact and bridging contact, and operating in sequence to attract or deflect the bridging contact towards or away from the base contact by electrostatic forces.

5. A bi-stable memory element according to claim 1, further including deflection means both above and below the bridging contact.

6. A bi-stable memory element according to claim 1, wherein the element is in an atmosphere of high relative breakdown voltage gas.

7. A bi-stable memory element according to claim 6, wherein the gas is perfluoropropane.

8. A bi-stable memory element according to claim 1, wherein the bridging contact is strengthened across at least part of its unsupported length.

9. A hi-stable memory element according to claim 8, wherein the strengthening is provided by corrugations on the bridging contact surface.

10. A bi-stable memory element according to claim 8, wherein the strengthening is provided by an additional layer on the bridging contact surface.

11. A bi-stable memory element comprising:

a base contact, made from an electrically conductive material;

a bridging contact, made from an electrically conductive material, and dimensioned so as to have two stable positions, in one of which the bridging contact is in contact with the base contact, and in the other of which the bridging contact is spaced apart from the base contact; and deflection means, for deflecting the bridging contact from one stable position to the other, wherein said deflection means comprises a pair of electrodes, electrically insulated from the base contact and bridging contact, and operating in sequence to attract or deflect the bridging contact towards or away from the base contact by electrostatic forces.

* * * * *